US007739654B2

(12) United States Patent
Lacey et al.

(10) Patent No.: US 7,739,654 B2
(45) Date of Patent: Jun. 15, 2010

(54) MODEL CURATION FOR INTEGRATED CIRCUIT DESIGNS

(75) Inventors: David John Lacey, Frisco, TX (US); Nathan Dirk Zelle, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 806 days.

(21) Appl. No.: 11/021,314

(22) Filed: Dec. 22, 2004

(65) Prior Publication Data

US 2006/0136521 A1 Jun. 22, 2006

(51) Int. Cl.
*G06F 9/44* (2006.01)
*H03K 17/693* (2006.01)

(52) U.S. Cl. .................. 717/104; 717/106; 717/110; 716/16; 716/18; 707/203; 707/204

(58) Field of Classification Search ......... 717/104–113; 716/16, 18; 707/3, 102, 203, 204; 703/1, 703/8, 13, 14, 16, 17
See application file for complete search history.

(56) References Cited

U.S. PATENT DOCUMENTS

| | | | |
|---|---|---|---|
| 5,710,934 A | 1/1998 | Bona et al. | |
| 5,787,444 A * | 7/1998 | Gerken et al. | 707/203 |
| 5,845,128 A * | 12/1998 | Noble et al. | 717/170 |
| 5,867,396 A * | 2/1999 | Parlour | 716/18 |
| 5,937,411 A * | 8/1999 | Becker | 707/103 R |
| 6,195,795 B1 * | 2/2001 | Block et al. | 717/101 |
| 6,668,360 B1 * | 12/2003 | Liu | 716/4 |
| 6,874,146 B1 * | 3/2005 | Iyengar | 719/313 |
| 6,952,825 B1 * | 10/2005 | Cockx et al. | 718/102 |
| 6,973,638 B1 * | 12/2005 | Gangopadhyay et al. | 717/104 |
| 7,047,518 B2 * | 5/2006 | Little et al. | 717/108 |
| 7,130,783 B1 * | 10/2006 | Harer et al. | 703/13 |
| 7,149,990 B2 * | 12/2006 | Pertuit et al. | 716/5 |
| 7,191,429 B2 * | 3/2007 | Brassard et al. | 717/104 |
| 7,231,410 B1 * | 6/2007 | Walsh et al. | 707/203 |
| 7,299,446 B2 * | 11/2007 | He et al. | 716/18 |
| 2002/0133772 A1 * | 9/2002 | Voorakaranam et al. | 714/732 |

* cited by examiner

*Primary Examiner*—Wei Y Zhen
*Assistant Examiner*—Satish Rampuria

(57) ABSTRACT

Exemplary techniques for model curation are described. In a described embodiment, a method comprises generating a manifest of a plurality of files corresponding to a design model; utilizing a revision control system to determine whether the generated manifest has changed relative to a previous version of the manifest; and if the generated manifest has changed, obtaining copies of the plurality of files to validate stability of the design model and curating the design model.

19 Claims, 4 Drawing Sheets

MODEL CURATION FOR INTEGRATED CIRCUIT DESIGNS

TECHNICAL FIELD

The present description generally relates to electronic computing. More particularly, an embodiment relates to model curation.

BACKGROUND

Curation is generally utilized when designing integrated circuits (ICs). Often, various engineering teams work on different blocks of an IC design simultaneously. Each block may be represented in various computer files. To build a full model of the IC, a curation process is utilized to pull together a desired version of each of these blocks that are under design by the various design teams.

Generally, curation efforts are time-consuming, in part, because they often involve manual intervention by an operator. Also, on the same project, different curation methodologies may be utilized by different teams within that one project. These methodologies can often be incompatible, and maintaining these different curation efforts across a project is inefficient. Furthermore, with distributed and separate curation tools, it is difficult to make global curation changes across an entire project.

SUMMARY

In a described embodiment, a method comprises generating a manifest of a plurality of files corresponding to a design model; utilizing a revision control system to determine whether the generated manifest has changed relative to a previous version of the manifest; and if the generated manifest has changed, obtaining copies of the plurality of files to validate stability of the design model and curating the design model.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Exemplary techniques for model curation are described. The techniques enable efficient model curation, for example, by allowing periodic stability checks of a model and/or by using a customizable set of common tools and/or processes across different models. Such embodiments are envisioned to reduce maintenance costs associated with model curation, in part, due to the uniformity of tools applied across multiple models (e.g., which may correspond to entirely different projects). This further reduces or eliminates the need for frequent operator intervention. Additionally, global curation changes may be more readily made across an entire project.

Model Curation System Overview

Figure 1:
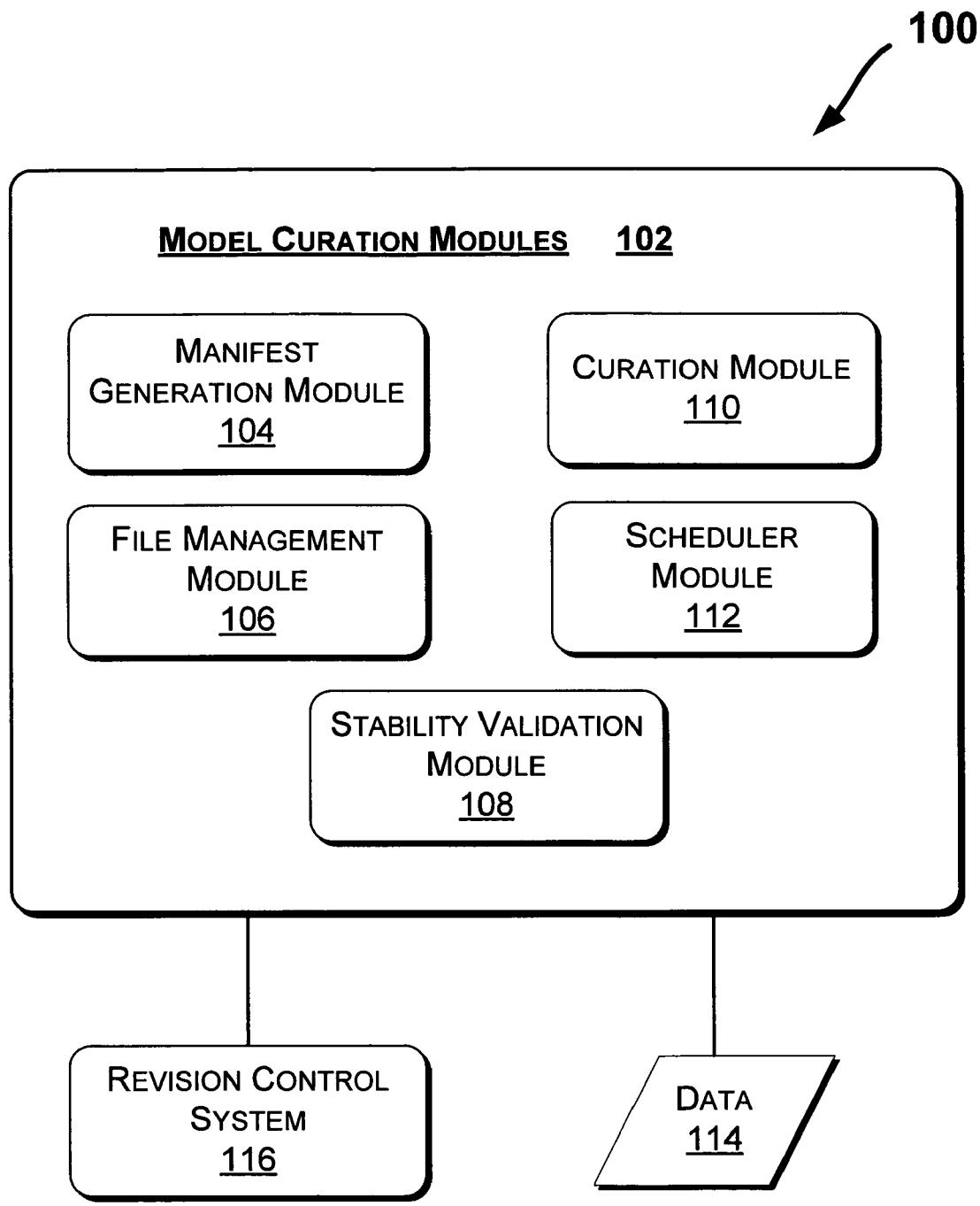
FIG. 1 illustrates an exemplary model curation system, according to an embodiment.

FIG. 1 illustrates an exemplary model curation system 100. The model curation system 100 includes one or more model curation modules (or software tools) 102 such as a manifest generation module 104, a file management module 106, a stability validation module 108, a curation module 110, and a scheduler module 112. As illustrated in FIG. 1, the modules 104-112 may have access to a data source (114). It is envisioned that the data 114 may include one or more electronic storage units (such as those discussed with reference to FIG. 4), e.g., one or more files, databases, etc. that may be physically located at various locations (including remote locations).

In an embodiment, the scheduler module 112 runs the other curation modules (e.g., 104-110) at a predetermined schedule, for example, hourly, daily, weekly, and the like. As will be discussed with reference to FIG. 2, the scheduler module 112 may initialize a curation method (200) or system (100), e.g., by generating a working directory, run one or more of the four modules above, check for the completion or failure of the processes (or tasks), and/or perform post-processing tasks.

The model curation system 100 may further include a revision control system (RCS) 116 which may be in electronic communication with one or more of the model curation modules 102. The RCS 116 may be implemented as a database, a file, and the like. The RCS 116 may retain a history of changes to one or more files (e.g., data 114). The RCS 116 may assign a version number or identifier to the one or more files each time a change is saved. Accordingly, the RCS 116 may capture an image of each individual change upon submission of that change to the RCS 116. For example, in a chip design scenario, an engineer may change the design of an IC sub-block, and upon obtaining a satisfactory result, the engineer may submit the change (that may identify a number of associated files) to an RCS. The RCS will in turn assign revision identifier(s) or number(s) to the new or changed file(s) and maintain data regarding the revision made by the engineer, for example, for future processing by model curation modules (e.g., 104-112 of FIG. 1).

Model Curation Process

Figure 2:
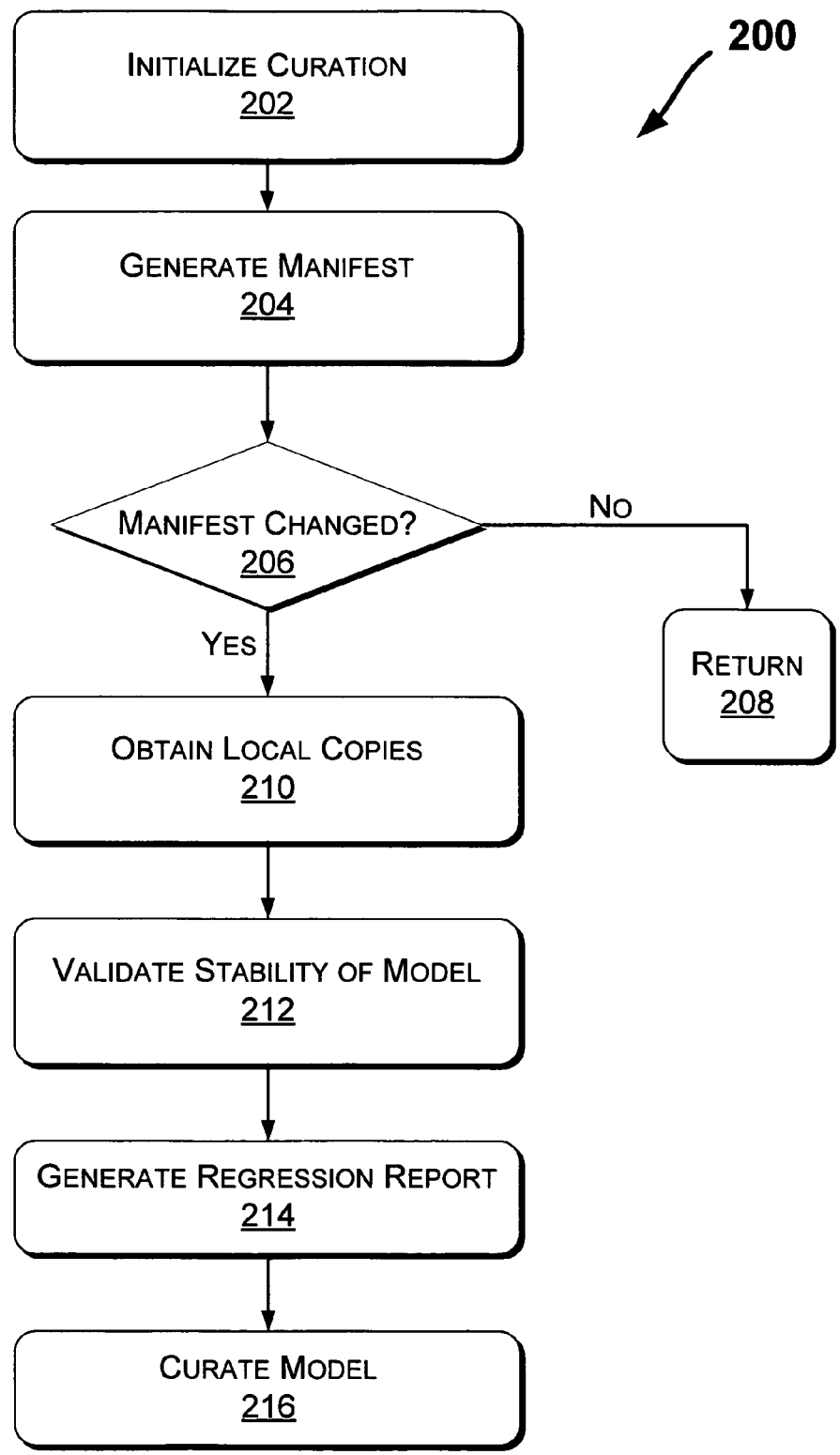
FIG. 2 illustrates an exemplary model curation method, according to an embodiment.

FIG. 2 illustrates an exemplary model curation method 200. The curation is initialized (202), e.g., by generating a new working directory. The initialization stage 202 is envisioned to ensure that new information provided by a generated manifest (204) is utilized in performing the stages of model curation method 200, without relying on a previously generated manifest which may interfere with the operation of the model curation method (200). In an embodiment, the method 200 may be run in accordance with a predetermined schedule (such as discussed with reference to the scheduler module 112 of FIG. 1). A periodic schedule is envisioned to enable continuous and/or early detection of incompatibilities that may be present in a subsequent generation of a design (e.g., due to changes made to a previous generation).

The generated manifest (204) may provide a list of filenames, including path and their specific revision numbers or identifiers (e.g., by accessing the RCS 116 of FIG. 1) that correspond to the model being curated. This information may be stored in a manifest file that may be part of the data 114. It is envisioned that a manifest file captures a list of filenames and revisions. In generating the manifest (204), certain constraints may be considered (e.g., from the data 114) that specify which directories, files, and/or other manifests located in a RCS should be searched.

After the manifest is generated (204), it is determined whether the generated manifest has changed relative to a previous manifest (206). For example, the generated manifest may be compared to a previously stored manifest. Alternatively, a RCS (such as 116 of FIG. 1) may be utilized to determine whether the newly generated manifest includes changes. If it is determined that the generated manifest is unchanged, the method 200 stops (208) and awaits another invocation (for example, by the scheduler module 112 of FIG. 1). Upon reaching the stage 208, the effects of the initialization stage 202 may be reversed, e.g., the created working directory may be removed.

If the manifest has changed (206), local (or separate) copies of all the files specified by the manifest are obtained (210), e.g., copied into the created working directory of the stage 202 from an RCS. The stage 210 may be performed by the file management module 106 of FIG. 1. It is envisioned that the stage 210 may be performed by obtaining manifest data from standard input devices (e.g., a keyboard or other input devices discussed with reference to FIG. 4), from another program's output, from a manifest generation module (104), and/or from a file. The obtained files are then utilized to validate stability of the model at hand (212).

In an embodiment, the validation may be performed by executing one or more instructions (regression stages), e.g., as previously determined and for example stored in a file (such as the data 114 of FIG. 1). These instructions may be customizable to the specific curation required by each individual model. A regression report presenting the success or failure of each regression stage may be generated (214) and utilized to curate the model (216) as will be further discussed with reference to FIG. 3.

Curation Stages

Figure 3:
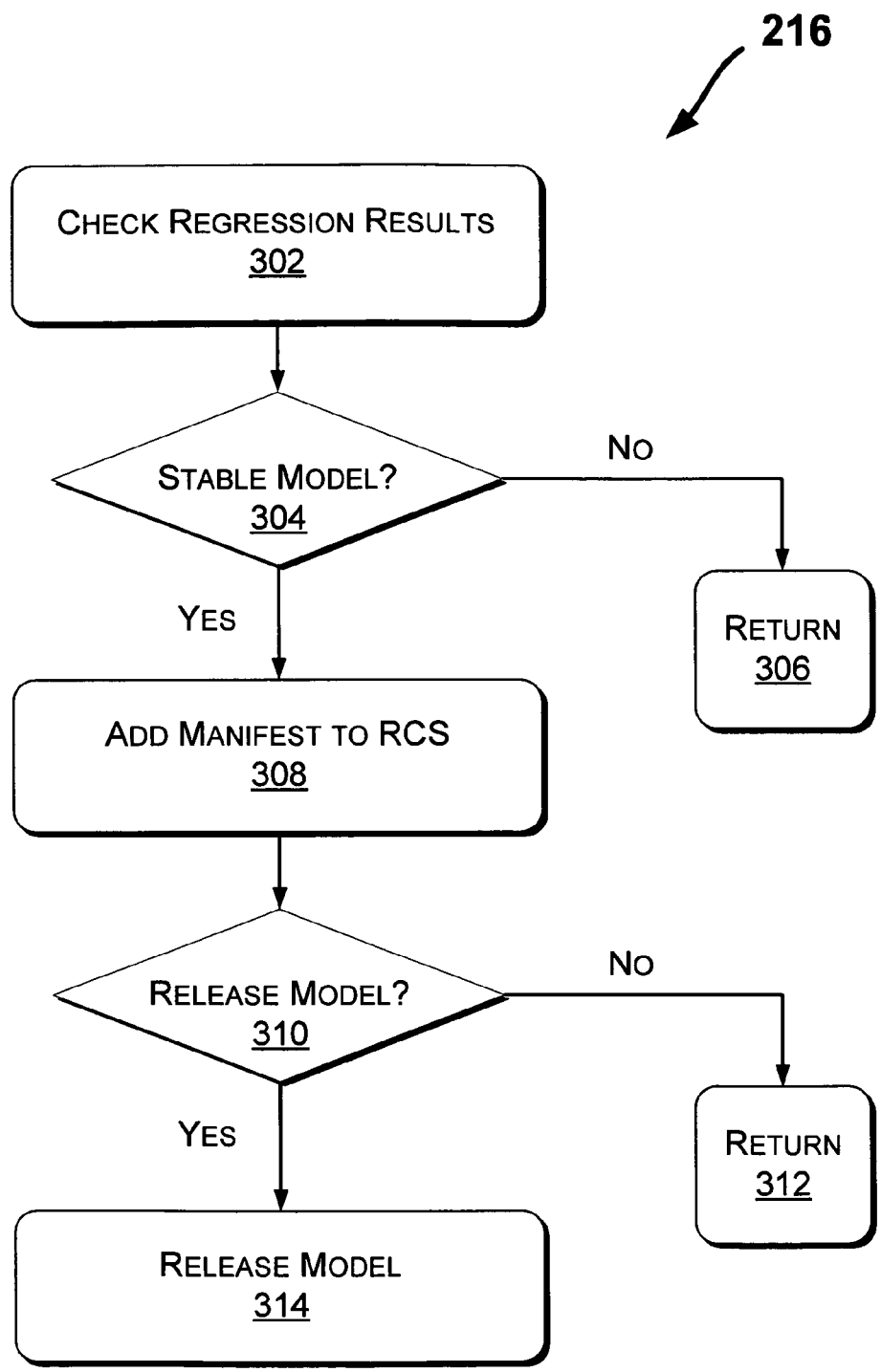
FIG. 3 illustrates exemplary curation stages corresponding to the model curation stage 216 of FIG. 2, according to an embodiment.

FIG. 3 illustrates exemplary curation stages corresponding to the model curation stage 216 of FIG. 2. The regression results (e.g., the regression report generated by 214 of FIG. 2) are checked (302) to determine whether the files contained within the generated manifest (e.g., 204 of FIG. 2) represent a model within a minimum level of correctness. The exact definition of this minimum level of correctness may be predetermined and described in a file (e.g., the data 114 of FIG. 1). If the minimum level of correctness is not reached (i.e., model is not stable), the curation terminates (306). The unsuccessful curation result may be sent to one or more destinations such as an operator console, a file, an email address, a pager number, and the like. The destination may be predetermined, e.g., in the data 114. Additionally, the working files may be archived, for example, to enable future checks by an operator.

Once the regression results are checked and it is determined that the model is stable (304) (i.e., meets the minimum level of correctness), then the manifest is accepted and added to an RCS (such as 116 of FIG. 1). Also, a notification regarding the stability of the model may be sent to one or more destinations such as an operator console, a file, an email address, a pager number, and the like. These destination may be predetermined, e.g., in the data 114.

After the manifest is added to the RCS (308), all files specified by the manifest may be marked with a symbolic identifier in the RCS. The symbolic identifier may also be used to mark the manifest, indicating corresponding versions of the manifest and the files specified by that version of the manifest. Next, it is determined whether the model should be released (310). Whether or not the model is to be released (and how—what stages should be performed for the actual release) may be predetermined, e.g., as indicated by the data 114 discussed with reference to FIG. 1.

If it is determined that the model should remain unreleased, the curation terminates (312). The unreleased curation result may be sent to one or more destinations such as an operator console, a file, an email address, a pager number, and the like. The destination may be predetermined, e.g., in the data 114. Additionally, the working files may be archived, for example, to enable future checks by an operator. The unreleased curation result may include manifest information, comparison data regarding the presently generated manifest and any present changes, and the like.

Alternatively, if it is determined that the model is to be released, one or more release commands may be executed (314) that are customizable for each model (e.g., and read from the data 114 of FIG. 1). For example, copies of the release results may be distributed to specific members of a team. Also, it is envisioned that a stability check (304) may be run on a different periodic basis than the model release (314) such as running a check every night, but releasing the model weekly.

Exemplary Computing Environment

Figure 4:
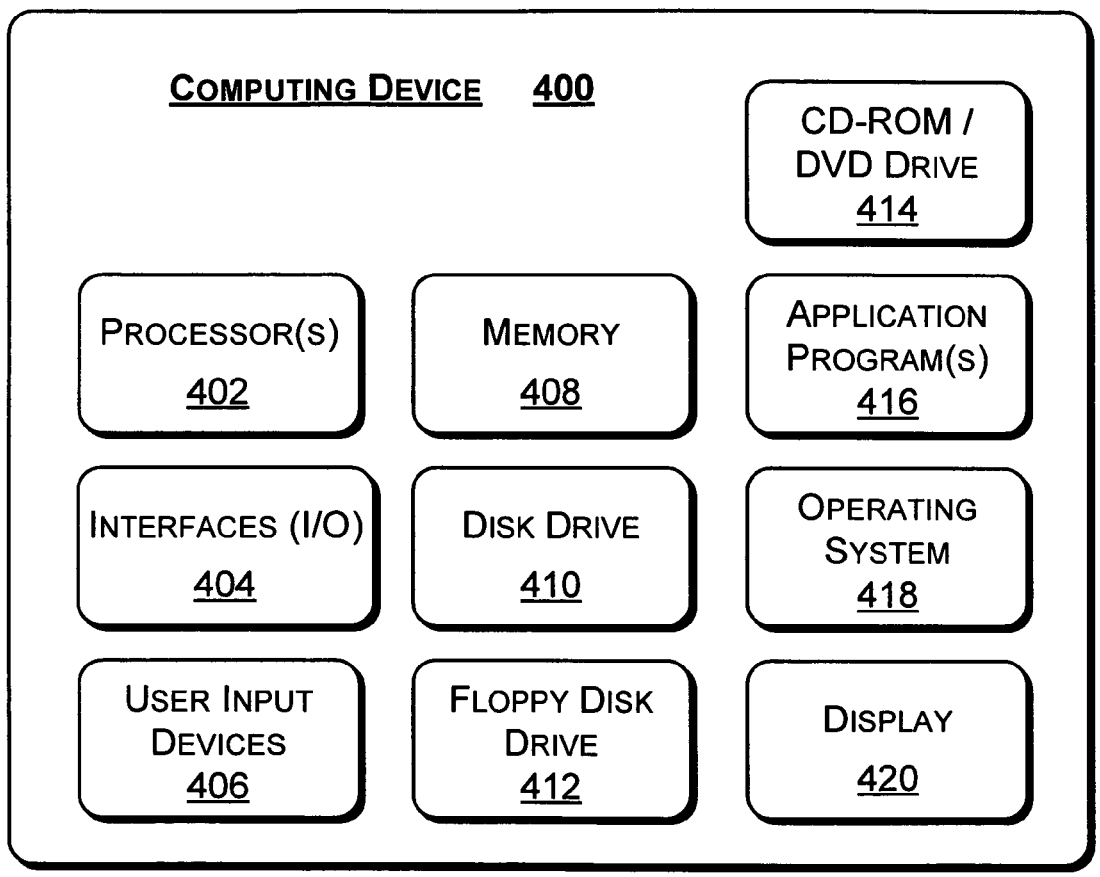
FIG. 4 illustrates various components of an exemplary computing device which may be utilized to implement portions of the techniques discussed herein, according to an embodiment.

FIG. 4 illustrates various components of an exemplary computing device 400 which may be utilized to implement portions of the techniques discussed herein. In one embodiment, the computing device 400 can be used to perform the methods of FIGS. 2 and 3. The computing device 400 may also be used to provide the system 100 of FIG. 1.

The computing device 400 includes one or more processor(s) 402 (e.g., microprocessors, controllers, etc.), input/output interfaces 404 for the input and/or output of data, and user input devices 406. The processor(s) 402 process various instructions to control the operation of the computing device 400, while the input/output interfaces 404 provide a mechanism for the computing device 400 to communicate with other electronic and computing devices. The user input devices 406 can include a keyboard, mouse, pointing device, and/or other mechanisms to interact with, and to input information to the computing device 400.

The input/output interfaces 404 can include serial, parallel, and/or network interfaces. A network interface allows devices coupled to a common data communication network to communicate information with the computing device 400. Similarly, a communication interface, such as a serial and/or parallel interface, a universal serial bus (USB) interface, an Ethernet interface, an Institute of Electrical & Electronics Engineers (IEEE) 802.11 interface, and/or any combination of wireless or wired communication interfaces provides a data communication path directly (or through intermediate computing device(s) or network component(s)) between the computing device 400 and another electronic or computing device.

The computing device 400 may also include a memory 408 (such as read-only memory (ROM) and/or random-access memory (RAM)), a disk drive 410, a floppy disk drive 412, and a compact disk read-only memory (CD-ROM) and/or digital video disk (DVD) drive 414, which may provide data storage mechanisms for the computing device 400. Any number and combination of memory and storage devices can be connected with, or implemented within, the computing device 400. Although not shown, a system bus typically connects the various components within the computing device 400.

The computing device 400 also includes one or more application program(s) 416 and an operating system 418 which can be stored in non-volatile memory (e.g., the memory 408)

and executed on the processor(s) 402 to provide a runtime environment in which the application program(s) 416 can run or execute. The computing device 400 can also include an integrated display device 420, such as for a PDA, a portable computing device, and any other mobile computing device.

Select embodiments discussed herein (such as those discussed with reference to FIGS. 1-3) may include various operations. These operations may be performed by hardware components or may be embodied in machine-executable instructions, which may be in turn utilized to cause a general-purpose or special-purpose processor, or logic circuits programmed with the instructions to perform the operations. Alternatively, the operations may be performed by a combination of hardware and software.

Moreover, some embodiments may be provided as computer program products, which may include a machine-readable or computer-readable medium having stored thereon instructions used to program a computer (or other electronic devices) to perform a process discussed herein. The machine-readable medium may include, but is not limited to, floppy diskettes, hard disk, optical disks, CD-ROMs, and magneto-optical disks, ROMs, RAMs, erasable programmable ROMs (EPROMs), electrically EPROMs (EEPROMs), magnetic or optical cards, flash memory, or other types of media or machine-readable media suitable for storing electronic instructions and/or data. Moreover, data discussed herein may be stored in a single database, multiple databases, or otherwise in select forms (such as in a table).

Additionally, some embodiments discussed herein may be downloaded as a computer program product.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment.

Thus, although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention. For example, the techniques discussed herein may be applied to any curation process to provide efficiency and/or ease of maintenance.

What is claimed is:

1. A computer implemented method comprising:
generating a manifest of a plurality of files corresponding to a design model corresponding to an integrated circuit device;
utilizing a revision control system to determine whether the generated manifest has changed relative to a previous version of the manifest; and
if the generated manifest has changed, obtaining copies of the plurality of files to validate stability of the design model and curating the design model, wherein data corresponding to the manifest is to be stored in a storage unit and used in the design model of the integrated circuit device, wherein the method is performed periodically to detect incompatibilities present in a subsequent generation of the design model and wherein the curating of the design model comprises:
checking one or more regression results generated by the act of validating stability of the design model;
determining whether the design model is stable;
wherein one or more regression results are checked to determine whether the files contained within the generated manifest represent the design model with a minimum level of correctness;
if the minimum level of correctness is not present then the design model is determined to be unstable and curating the design model is terminated; and
if it is determined that the design model is stable, adding the generated manifest to the revision control system.

2. The method of claim 1, wherein the curating of the design model comprises:
checking one or more regression results generated by the act of validating stability of the design model;
determining whether the design model is stable; and
if it is determined that the design model is stable, adding the generated manifest to the revision control system and determining whether the design model is to be released.

3. The method of claim 1, wherein the curating of the design model comprises:
checking one or more regression results generated by the act of validating stability of the design model;
determining whether the design model is stable;
if it is determined that the design model is stable, adding the generated manifest to the revision control system and determining whether the design model is to be released; and
if it is determined that the design model is to be released, releasing the design model.

4. The method of claim 1, wherein the generated manifest is stored in a data file.

5. The method of claim 1, further comprising initializing a curation, wherein the curation initialization comprises generating a new working directory to store the obtained copies of the plurality of files.

6. The method of claim 1, further comprising:
modifying an integrated circuit sub-block design corresponding to an integrated circuit sub-block, the design model comprising the integrated circuit sub-block design;
validating the integrated circuit sub-block design to determine whether the modification produces a select result; and
submitting the modified and validated integrated circuit sub-block design to the revision control system to generate the subsequent generation of the design model.

7. A system comprising:
a memory to store a manifest generation module and a processor to generate a manifest of a plurality of files corresponding to a design model corresponding to an integrated circuit device;
a revision control system to determine whether the generated manifest has changed relative to a previous version of the manifest;
a file management module to obtain copies of the plurality of files to validate stability of the design model;
a curation module to curate the design model;
a storage unit to store data corresponding to the manifest, wherein the stored data is to be used in design of the integrated circuit device; and
a scheduler module to periodically run one or more of the other system modules to detect incompatibilities present in a subsequent generation of the design model,
wherein the curation module is configured to perform one or more acts comprising:
checking one or more regression results generated by a stability validation module;
determining whether the design model is stable;
wherein one or more regression results are checked to determine whether the files contained within the generated manifest represent the design model with a minimum level of correctness;

if the minimum level of correctness is not present then the design model is determined to be unstable and curating the design model is terminated; and if it is determined that the design model is stable, adding the generated manifest to the revision control system.

8. The system of claim 7, further comprising a stability validation module to validate stability of the design model.

9. The system of claim 7, further comprising a scheduler module to perform one or more acts selected from a group comprising running one or more of the other system modules, initializing the system, checking for completion of one or more tasks, checking for failure of one or more tasks, and performing one or more post-processing tasks.

10. The system of claim 7, wherein the system has access to a data source to provide design modeling information to the system.

11. The system of claim 7, wherein the curation module is configured to perform one or more acts comprising:

checking one or more regression results generated by a stability validation module;

determining whether the design model is stable; and if it is determined that the design model is stable, adding the generated manifest to the revision control system and determining whether the design model is to be released.

12. The system of claim 7, wherein the curation module is configured to perform one or more acts comprising:

checking one or more regression results generated by a stability validation module;

determining whether the design model is stable; and if it is determined that the design model is stable, adding the generated manifest to the revision control system and determining whether the design model is to be released; and if it is determined that the design model is to be released, releasing the design model.

13. The system of claim 7, wherein the generated manifest is stored in a data file.

14. The system of claim 7, further comprising:

an integrated circuit sub-block design corresponding to an integrated circuit sub-block, the design model comprising the integrated circuit sub-block design, wherein the subsequent generation of the design model is generated based on: modifying the integrated circuit sub-block design and validating whether the integrated circuit sub-block design produces a select result, wherein the modified and validated integrated circuit sub-block design is submitted to the revision control system.

15. One or more computer-readable media having instructions stored thereon that, when executed, direct a machine to perform acts comprising:

generating a manifest of a plurality of files corresponding to a design model corresponding to an integrated circuit device;

utilizing a revision control system to determine whether the generated manifest has changed relative to a previous version of the manifest; and if the generated manifest has changed, obtaining copies of the plurality of files to validate stability of the design model and curating the design model, wherein data corresponding to the manifest is to be stored in a storage unit and used in design of the integrated circuit device, wherein the acts are to be performed periodically to detect incompatibilities present in a subsequent generation of the design model and wherein the curating of the design model comprises:

checking one or more regression results generated by the act of validating stability of the design model;

determining whether the design model is stable;

wherein one or more regression results are checked to determine whether the files contained within the generated manifest represent the design model with a minimum level of correctness;

if the minimum level of correctness is not present then the design model is determined to be unstable and curating the design model is terminated; and if it is determined that the design model is stable, adding the generated manifest to the revision control system.

16. The one or more computer-readable media of claim 15, having instructions stored thereon that, when executed, direct a machine to perform acts further comprising:

modifying an integrated circuit sub-block design corresponding to an integrated circuit sub-block, the design model comprising the integrated circuit sub-block design;

validating the integrated circuit sub-block design to determine whether the modification produces a select result; and submitting the modified and validated integrated circuit sub-block design to the revision control system to generate the subsequent generation of the design model.

17. An apparatus comprising:

means for generating a manifest of a plurality of files corresponding to a design model corresponding to an integrated circuit device; and means for utilizing a revision control system to determine whether the generated manifest has changed relative to a previous version of the manifest;

means for validating stability of the design model and curating the design model;

means for storing data corresponding to the manifest for use in design of the integrated circuit device; and scheduling means for periodically running one or more of the other means for detecting incompatibilities present in a subsequent generation of the design model, wherein means for curating the design model is configured to perform one or more acts comprising:

checking one or more regression results generated by a stability validation module;

determining whether the design model is stable;

wherein one or more regression results are checked to determine whether the files contained within the generated manifest represent the design model with a minimum level of correctness;

if the minimum level of correctness is not present then the design model is determined to be unstable and curating the design model is terminated; and if it is determined that the design model is stable, adding the generated manifest to the revision control system.

18. The apparatus of claim 17, further comprising means for initializing a curation.

19. The apparatus of claim 17, further comprising:

means for generating the subsequent generation of the design model, wherein means for generating the subsequent generation of the design model is configured to perform one or more acts comprising:

modifying an integrated circuit sub-block design corresponding to an integrated circuit sub-block, the design model comprising the integrated circuit sub-block design;

validating the integrated circuit sub-block design to determine whether the modification produces a select result; and submitting the modified and validated integrated circuit sub-block design to the revision control system.

* * * * *